United States Patent
Kinugasa et al.

(10) Patent No.: US 6,924,694 B2
(45) Date of Patent: Aug. 2, 2005

(54) SWITCH CIRCUIT

(75) Inventors: Masanori Kinugasa, Kanagawa (JP);
Akira Takiba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/647,290

(22) Filed: Aug. 26, 2003

(65) Prior Publication Data

US 2004/0232973 A1 Nov. 25, 2004

(30) Foreign Application Priority Data

May 23, 2003 (JP) ........................................ 2003-146297

(51) Int. Cl.[7] ...................... H01L 25/10; H03K 17/687; H03K 17/60
(52) U.S. Cl. .......................... 327/566; 327/437; 327/484
(58) Field of Search ........................ 327/427, 431–434, 327/437, 566, 576, 581, 484, 478, 504

(56) References Cited

U.S. PATENT DOCUMENTS 5,731,732 A * 3/1998 Williams .................... 327/434
RE36,179 E * 4/1999 Shimoda ..................... 327/407
5,892,387 A    4/1999 Shigehara et al. .......... 327/537
6,169,443 B1   1/2001 Shigehara et al. .......... 327/534
6,462,611 B2  10/2002 Shigehara et al. .......... 327/534
6,504,424 B1 * 1/2003 Heminger et al. .......... 327/566

* cited by examiner

Primary Examiner—Terry D. Cunningham
Assistant Examiner—Terry L. Englund
(74) Attorney, Agent, or Firm—Oblon, Spivak, McClelland, Maier & Neustadt, P.C.

(57) ABSTRACT

A switch circuit formed on a semiconductor substrate, comprising: a first terminal to which a signal of transmission object is inputted; a second terminal from which a signal of transmission object is outputted; a first transistor formed in a first semiconductor region in said semiconductor substrate, which has one of a source and a drain terminals connected to said first terminal and another thereof connected to said second terminal; a control circuit which controls a gate voltage of said first transistor; and a first rectifying element which has an anode terminal connected to said first terminal, a cathode terminal connected to a power supply terminal of said control circuit, said first rectifying element being formed in a second semiconductor region in said semiconductor substrate separate from said first semiconductor region.

21 Claims, 5 Drawing Sheets

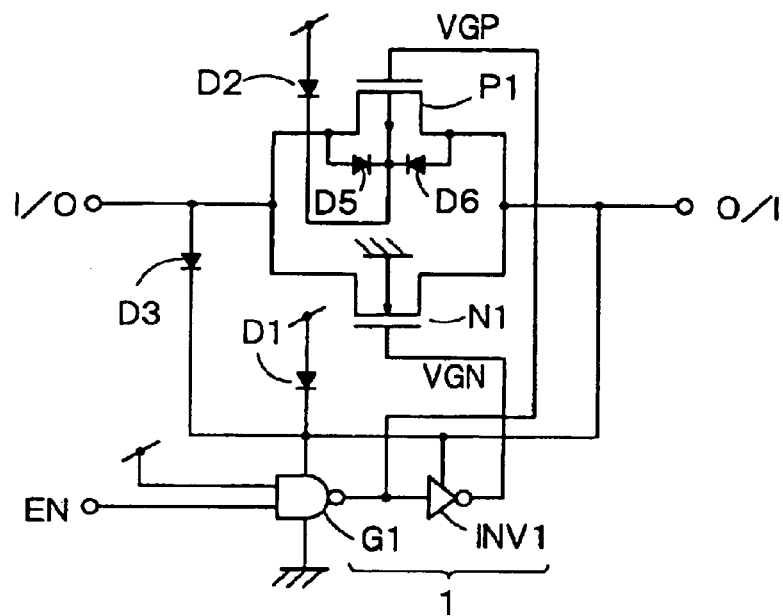
F I G. 7

SWITCH CIRCUIT

CROSS REFERENCE TO RELATED APPLICATIONS

This application claims benefit of priority under 35USC § 119 to Japanese Patent Application No. 2003-146297, filed on May 23, 2003, the entire contents of which are incorporated by reference herein.

BACKGROUND OF THE INVENTION

1. Field of the Invention

The present invention relates to a switch circuit for switching passing/cutting-off of a signal. Especially, the present invention relates to a technique for forming such kind of a circuit on a semiconductor substrate.

2. Related Art

An analog switch circuit for switching passing/cutting-off of a signal between two types of bi-directional input/output terminals is known. FIG. 8 is a circuit diagram of such kind of a conventional analog switch circuit (U.S. Pat. No. 5,892,387).

The analog switch circuit of FIG. 8 has a PMOS transistor P1 and an NMOS transistor N1 in which source terminals/drain terminals are connected to each other, and a control circuit 1 for controlling on/off of the transistors P1 and N1. One of the source/drain terminals of the PMOS transistor P1 and one of the source/drain terminals of the NMOS transistor N1 are connected to a bi-directional first terminal I/O and another of the source/drain terminals of the PMOS transistor P1 and another of the source/drain terminals of the NMOS transistor N1 are connected to a bi-directional second terminal O/I.

The PMOS transistor P1 and the NMOS transistor N1 are turned on/off in sync with each other. A diode D5 is connected between the source terminal of the PMOS transistor P1 and a substrate, and a diode D6 is connected between the drain terminal and the substrate. A substrate of the NMOS transistor N1 is grounded.

The diodes D5 and D6 are diode parasitized between the source/drain terminal of the PMOS transistor P1 and the substrate. By providing the diodes D5 and D6, in a state that a power supply voltage is not supplied, when the voltages of the first and second voltages become higher than the power supply voltage, the gate voltage of the PMOS transistor P1 is raised from the first and second terminals I/O and O/I through the diodes D5 and D6 and the NAND gate G1 in order to turn off the transistor P1.

The control circuit 1 controls a gate voltage VGP of the PMOS transistor P1 and a gate voltage VGN of the NMOS transistor N1, and has the NAND gate G1 for inverting and outputting a control signal EN and an inverter INV1 for inverting and outputting an output of the NAND gate G1. The PMOS transistor P1 is turned on/off by the output of the NAND gate G1, and the NMOS transistor N1 is turned on/off by the output of the inverter INV1. The diode D1 is connected to the power supply line of the NAND gate G1 and the inverter INV1.

Next, operation of the analog switch circuit of FIG. 8 will be described hereinafter. First of all, when the power supply voltage is supplied, the analog switch is turned on/off in accordance with a logic of the control signal EN. More specifically, if the control signal EN is in high level, the output of the NAND gate G1 becomes low level, the output of the inverter INV1 becomes high level, and the PMOS transistor P1 and the NMOS transistor N1 turn on. Therefore, the signal can be transmitted and received between the first and second terminals I/O and O/I.

If the control signal EN is in low level, the output of the NAND gate G1 becomes high level, the output of the inverter INV1 becomes low level and the PMOS transistor P1 and the NMOS transistor N1 turn off. Therefore, the signal transmission path between the first and second terminals I/O and O/I are cut off.

On the other hand, when the power supply voltage is not supplied, the output of the NAND gate G1 becomes a voltage substantially equal to a cathode voltage of the diode D1, and the output of the inverter INV1 becomes low level. In this state, when a voltage exceeding the power supply voltage is supplied to the first and second terminals, the power supply voltage of the NAND circuit G1 rises via the diodes D5 and D6, and the output voltage of the NAND gate G1 also rises. Accordingly, the PMOS transistor P1 turns off, and the signal transmission path between the first and second terminals I/O and O/I is cut off.

The diodes D5 and D6 are formed in the same well as the PMOS transistor P1, and even if the voltages of the first and second terminals I/O and O/I rise, the voltage of the well does not rise immediately. Therefore, it takes too much time by when the output of the NAND gate G1 changes. Because of this, when the voltages of the first and second terminals rise sharply, the PMOS transistor P1 holds ON state for a certain time. Even if the power supply voltage is not supplied, the first and second terminals are brought into conduction.

For example, when the signal voltage supplied to the first terminal I/O rises sharply, a time lag occurs until when the PMOS transistor P1 turns off. Accordingly, the signal is transmitted to the second terminal, and the second terminal discharges electric charge with time constant of the resistance load and capacitance load. However, when frequency of the signal transmitted and received between the first and second terminals I/O and O/I is high, before discharge is completely finished, operations in which next signal is supplied to the first terminal and again the second terminal is discharged are repeated. Because of this, the second terminal is maintained in a state of high level, and the signal transmission path between the first and second terminals is not cut off.

FIG. 9 is a diagram showing schematic configuration on a semiconductor substrate on which the analog switch circuit of FIG. 8 is formed. As shown in FIG. 9, the PMOS transistor P1 and the diode D5 and D6 are formed in the same well NW.

When the power supply voltage is not supplied to the analog switch circuit, if the voltage of the first or second terminal I/O or O/I rises sharply, the N well NW is charged by the voltage.

The sizes of the PMOS transistor P1 and the NMOS transistor N1 are large as many as several dozen times compared with the other transistors constituting the control circuit 1. As an example, transistor width of the PMOS transistor P1 of the inverter INV1 in the control circuit 1 is 10 μm, and the transistor width of the PMOS transistor P1 is 500 μm.

Because of this, the size of the N well NW shown in FIG. 9 becomes large, and the capacitance (about 5 pF) of the capacitor C for the semiconductor substrate also becomes large. Accordingly, delay of about 5 ns occurs due to resistance component (about 1 kΩ) of the N well NW and a time constant.

SUMMARY OF THE INVENTION

According to the present invention, a switch circuit formed on a semiconductor substrate, comprising:

a first terminal to which a signal of transmission object is inputted;

a second terminal from which a signal of transmission object is outputted;

a first transistor formed in a first semiconductor region in said semiconductor substrate, which has one of a source and a drain terminals connected to said first terminal and another thereof connected to said second terminal;

a control circuit which controls a gate voltage of said first transistor; and a first rectifying element which has an anode terminal connected to said first terminal, a cathode terminal connected to a power supply terminal of said control circuit, said first rectifying element being formed in a second semiconductor region in said semiconductor substrate separate from said first semiconductor region.

Furthermore, a switch circuit formed on a semiconductor substrate, comprising:

a first terminal to which a signal of transmission object is inputted;

a second terminal from which a signal of transmission object is outputted;

a p-type first transistor which has one of a source and a drain terminals connected to said first terminal and another thereof connected to said second terminal;

a control circuit which controls a gate voltage of said first transistor;

a first rectifying element formed in a first semiconductor region in said semiconductor substrate, which has an anode terminal to which a power supply voltage is supplied and a cathode terminal connected to a back gate of said first transistor; and a second rectifying element formed in a second semiconductor region in said semiconductor substrate separate from said first semiconductor region, which has an anode terminal connected to said first terminal and a cathode terminal connected to a power supply terminal of said control circuit.

BRIEF DESCRIPTION OF THE DRAWINGS

FIG. 7 is a diagram showing one example of an analog circuit capable of transmitting the signal from the first terminal I/O terminal only in a direction of the second terminal.

DESCRIPTION OF THE PREFERRED EMBODIMENTS

Hereinafter, a switch circuit according to the present invention will be more specifically described with regard to drawings. Hereinafter, an analog switch circuit will be described as an example of the switch circuit.

(First Embodiment)

Figure 1:
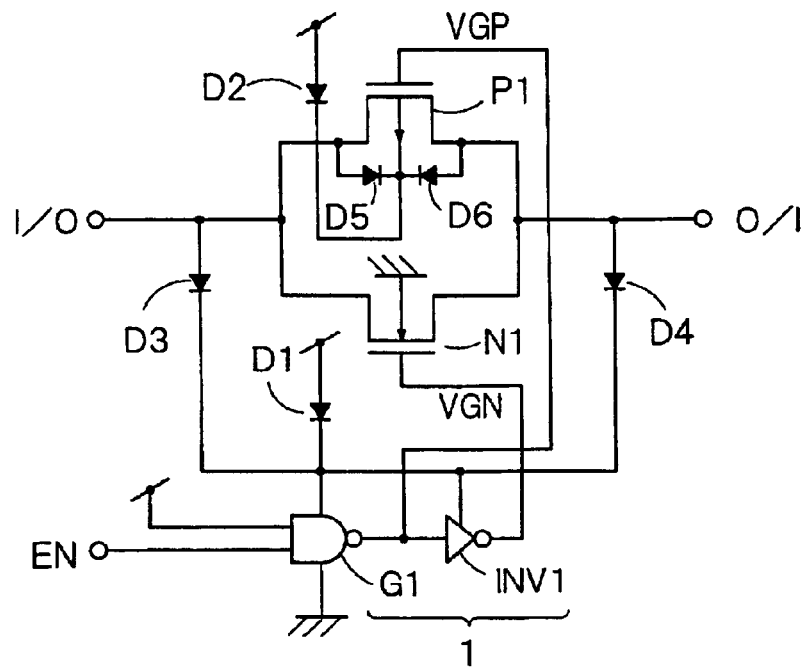
FIG. 1 is a circuit diagram of a first embodiment of an analog switch circuit according to the present invention.

FIG. 1 is a circuit diagram of a first embodiment of an analog switch circuit according to the present invention. The analog switch circuit of FIG. 1 has first and second terminals I/O and O/I for bi-directional signal input/output, a PMOS transistor P1 and an NMOS transistor N1 connected in parallel between the first and second terminals I/O and O/I, a control circuit 1 for controlling on/off of the transistors, and diodes D1–D6.

One of the source and drain terminals of the PMOS transistor P1 is connected to the first terminal, and another is connected to the second terminal. Similarly, one of the source and drain terminals of the NMOS transistor N1 is connected to the first terminal, and another is connected to the second terminal. The PMOS transistor P1 and the NMOS transistor N1 are turned on/off in sync with each other.

The control circuit 1 has an NAND gate G1 for inverting and outputting the control signal EN, and an inverter INV1 for inverting and outputting the output of the NAND gate G1. The PMOS transistor P1 is turned on/off by the output of the NAND gate G1, and the NMOS transistor N1 is turned on/off by the output of the inverter INV1.

Figure 2:
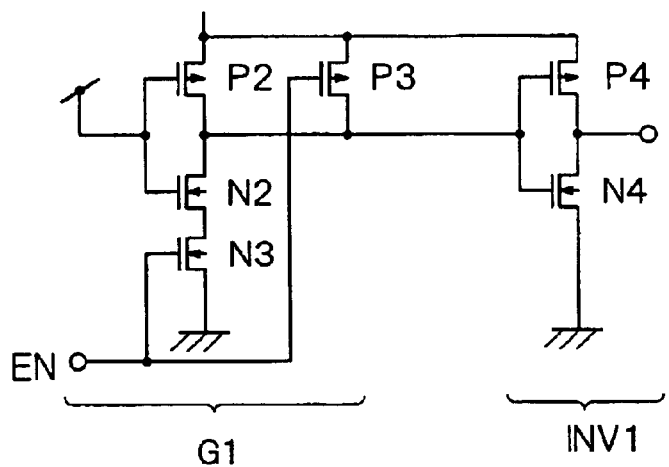
FIG. 2 is a diagram showing internal configuration of the control circuit 1.

FIG. 2 is a diagram showing internal configuration of the control circuit 1. The NAND gate G1 has PMOS transistors P2 and P3 and NMOS transistors N2 and N3. The inverter INV1 has the PMOS transistor P4 and the NMOS transistor N4 connected in series.

The power supply voltage is supplied to an anode terminal of the diode D1, and a cathode terminal thereof is connected to a power supply terminal of the control circuit 1. The power supply voltage is supplied to the anode terminal of the diode D2, and the cathode terminal thereof is connected on the substrate of the PMOS transistor P1. The substrate of the NMOS transistor N1 is grounded.

An anode terminal of the diode D3 is connected to the first terminal I/O, and a cathode terminal thereof is connected to the power supply terminal of the control circuit 1. The anode terminal of the diode D4 is connected to the second terminal O/I, and the cathode terminal thereof is connected to the power supply terminal.

An anode terminal of the diode D5 is connected to the first terminal I/O, and a cathode terminal thereof is connected on the substrate. An anode terminal of the diode D6 is connected to the second terminal O/I and a cathode terminal thereof is connected on the substrate.

The diodes D5 and D6 are diodes parasitized between the source/drain terminal of the PMOS transistor P1 and the substrate. The diodes D5 and D6 perform a function transmitting potentials of the first and second terminals I/O and O/I to the N well NW1. By providing the diodes D5 and D6, in a state that the power supply is not supplied, when a voltage higher than a power supply voltage is supplied to the first or second terminal terminal I/O or O/I, a substrate voltage of the PMOS transistor P1 is raised via the diodes D5 and D6.

Figure 8:
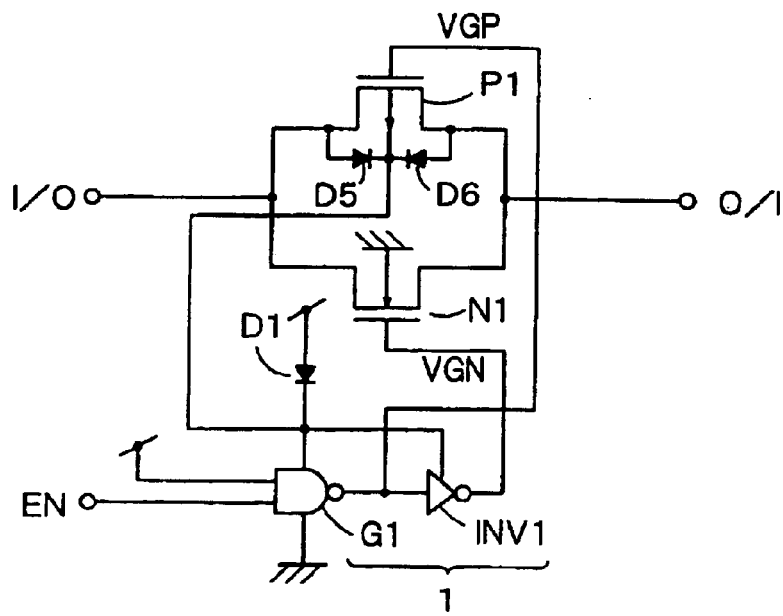
FIG. 8 is a circuit diagram of such kind of a conventional analog switch circuit.
Figure 9:
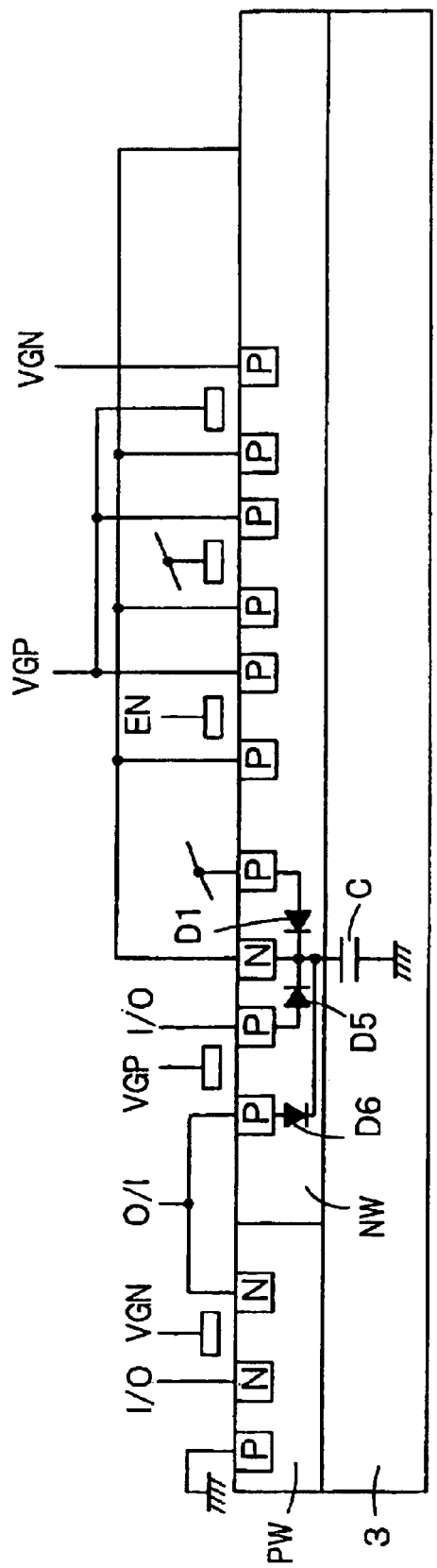
FIG. 9 is a diagram showing schematic configuration on a semiconductor substrate on which the analog switch circuit of FIG. 8 is formed.

Different from FIG. 8, the diodes D5 and D6 are used only to set the substrate potential of the PMOS transistor P1, and the diodes D3 and D4 formed in a different N well performs a potential control of the power supply terminal of the NAND gate G1.

Figure 3:
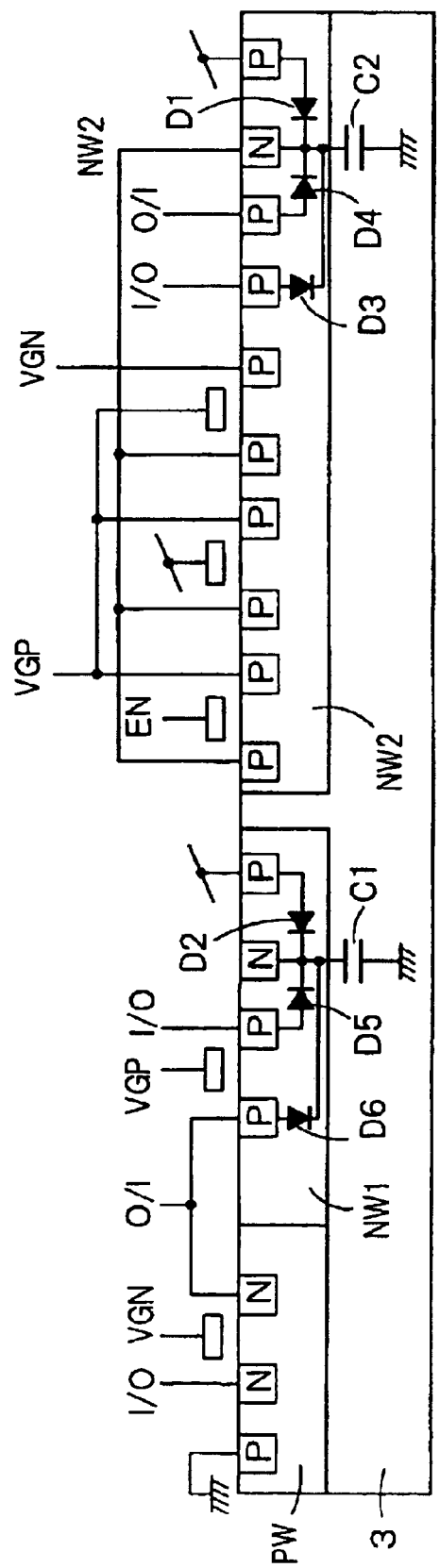
FIG. 3 is a diagram showing an example of schematic structure of a semiconductor substrate on which the analog switch circuit of FIG. 1 is formed.

FIG. 3 is a diagram showing an example of schematic structure of a semiconductor substrate on which the analog switch circuit of FIG. 1 is formed. As shown in FIG. 3, a P well PW and an N wells NW1 and NW2 are formed on the P type substrate 3. The NMOS transistor N1 is formed on the P well PW, the PMOS transistor P1 and the diodes D2, D5 and D6 are formed on the N well NW1, and the control circuit 1 and the diodes D1, D3 and D4 are formed on the N well NW2.

Next, operation of the analog switch circuit of FIGS. 1–3. First of all, operation in the case that the power supply voltage is supplied will be described. If the control signal EN is in high level, the output of the NAND gate G1 is in low level, and the output of the inverter INV1 is in high level. Because of this, the PMOS transistor P1 and the NMOS transistor N1 turn on, and signal transmission is bi-directional performed between the first terminals I/O and O/I.

Furthermore, if the control signal EN is in low level, the output of the NAND gate G1 becomes high level, and the output of the inverter INV1 becomes low level. Because of this, the PMOS transistor P1 and the NMOS transistor N1 turn off, and the signal transmission between the first and second terminals I/O and O/I is cut off.

On the other hand, when the power supply voltage is not supplied, the output of the inverter INV1 becomes low level, and the output of the NAND gate G1 becomes equal to a cathode voltage of the diode D1 as shown in FIG. 2. Because the output of the inverter INV1 is in low level, the NMOS transistor N1 is always in off state.

At this time, when a voltage higher than the power supply voltage is supplied to the first terminal I/O or the second terminal O/I, the cathode voltage of the diode D1 rises via a diode D3. Because of this, the output of the NAND gate G1 becomes high level, and the PMOS transistor P1 turns off. When the PMOS transistor P1 turns off, the signal transmission between the first and second terminals I/O and O/I is surely cut off.

Compared with the conventional analog switch circuit shown in FIG. 8, according to the present embodiment, the NAND gate G1 and the diodes D1, D3 and D4 are formed in the same N well NW2, and the PMOS transistor P1 and the diodes D2, D5 and D6 are formed in a N well NW1 different from the N well NW2.

That is, according to the present embodiment, two N wells NW1 and NW2 are provided. That is, the N well NW2 in which the diodes D1, D3 and D4 are formed are provided separate from the N well NW1 in which the PMOS transistor P1 is formed. Sizes of the N wells NW1 and NW2 are smaller than that of the conventional N well shown in FIG. 8. Accordingly, the capacitance of the capacitor C1 and the capacitance of the capacitor C2 are much smaller than the capacitance of the capacitor C of FIG. 8. More specifically, the capacitor C2 between the N well NW2 and the p type semiconductor substrate is 1/10 times of that of FIG. 8, i.e. about 0.5 pF. Accordingly, a time when sharp voltage rising of the first and second terminals I/O and O/I is transmitted to the power supply terminal of the NAND gate G1 is largely shortened, i.e. about 0.5 ns.

If assumed that about 0.5 ns is necessary for signal passing of the control circuit 1, it is possible to turn off the PMOS transistor P1 with a delay of 1.0 ns in total.

Thus, according to the present embodiment, the diodes D3 and D4 for transmitting sharp voltage rising of the first and second terminals I/O and O/I to the NAND gate G1 are formed in the N well NW2 provided separate from the N well NW1 in which the PMOS transistor P1 and the diodes D5 and D6 for the substrate potential setting are formed. Because of this, it is possible to largely downsize size of the N well compared with the conventional circuit, thereby quickly transmitting sharp voltage rising of the first and second terminals I/O and O/I to the power supply terminal of the NAND gate G1. Accordingly, when the voltages of the first and second terminals I/O and O/I has rapidly risen in a state that the power supply voltage is not supplied, it is possible to quickly turn off the PMOS transistor P1. Therefore, it is possible to surely cut off signal transmission between the first and second terminals I/O and O/I.

(Second Embodiment)

A switch circuit according to a second embodiment of the present invention constitutes the diodes D1–D4 of FIG. 1 by MOS transistors.

Figure 4:
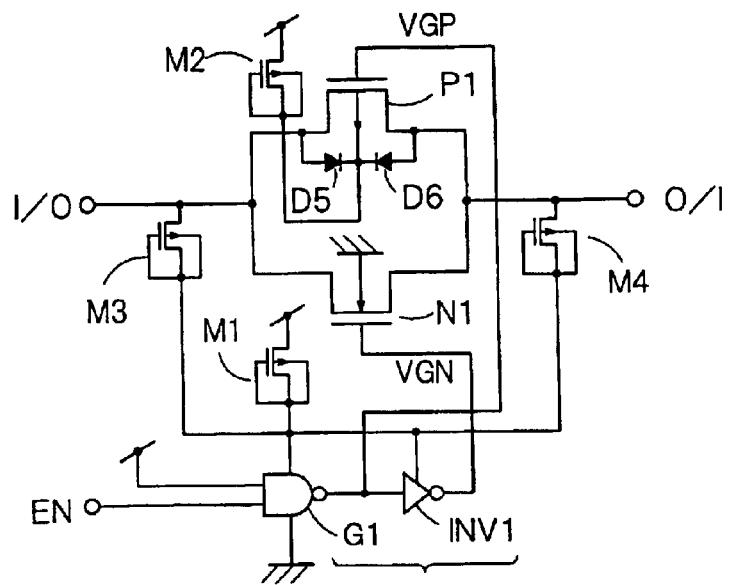
FIG. 4 is a analog switch circuit according to the second embodiment of the present invention.

FIG. 4 is an analog switch circuit according to the second embodiment of the present invention. In the analog switch circuit of FIG. 4, the diodes D1–D4 are composed of MOS transistors M1–M4. In these MOS transistors, source terminals are shortcut to the corresponding gate terminals.

Because operation of the circuit of FIG. 4 is completely the same as that of the circuit of FIG. 1, description is omitted.

Figure 5:
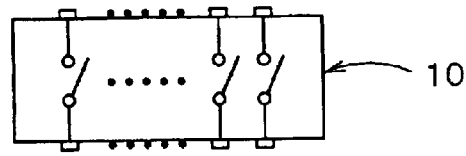
FIG. 5 is one example of a bus switch circuit.

The analog switch circuits of the above-mentioned first and second embodiments may be used as a bus switch circuit 10 containing a plurality of analog switch circuits in an IC package, as shown in FIG. 5. This kind of bus switch circuit 10 can be generally used in a digital circuit such as a data bus and an address bus.

In the above-mentioned embodiment, an example in which the analog switch circuit is constituted by using the MOS transistors has been described. The present invention can constitute by using bipolar transistors and Bi-CMOS transistors.

Figure 6:
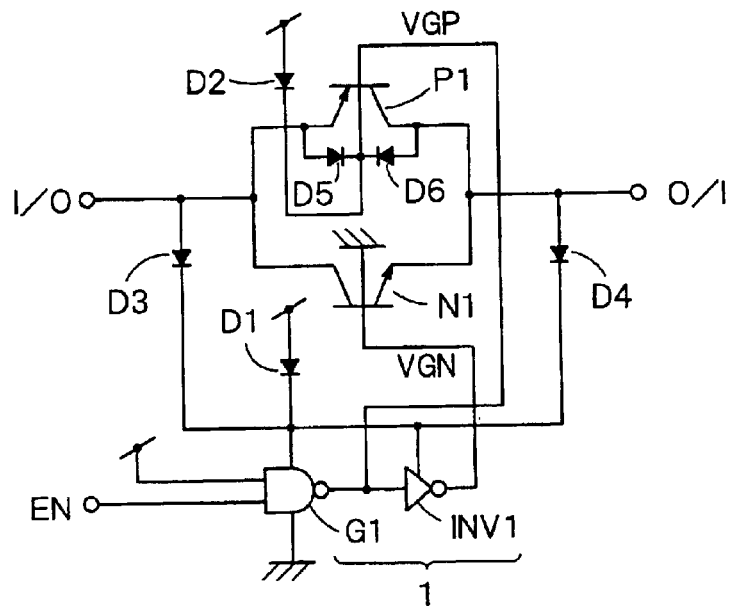
FIG. 6 is a diagram showing one example of a circuit constituted by using bipolar transistors P1 and N1.

FIG. 6 shows one example of a circuit constituted by using bipolar transistors P1 and N1. The circuit operation of FIG. 6 is the same as that of FIG. 1.

In the above-mentioned embodiment, an example in which the signals are bi-directional transmitted between the first and second terminals I/O and O/I has been described. The present invention is also applicable to the analog switch circuit for transmitting the signal in one direction.

For example, FIG. 7 shows one example of an analog circuit capable of transmitting the signal from the first terminal I/O terminal only in a direction of the second terminal. The circuit of FIG. 7 is the same as the circuit of FIG. 1 except that the diode is not connected between the second terminal O/I and the power supply terminal of the NAND gate G1.

What is claimed is:

1. A switch circuit formed on a semiconductor substrate, comprising:
    a first terminal to which a signal of transmission object is inputted;
    a second terminal from which a signal of transmission object is outputted;
    a first transistor formed in a first semiconductor region in said semiconductor substrate, which has one of source and drain terminals connected to said first terminal and another thereof connected to said second terminal;
    a control circuit configured to control a gate voltage of said first transistor; and
    a first rectifying element which has an anode terminal connected to said first terminal, a cathode terminal connected to a power supply terminal of said control circuit, said first rectifying element being formed in a second semiconductor region in said semiconductor substrate separate from said first semiconductor region.

2. The switch circuit according to claim 1, wherein said first transistor is a p type.

3. The switch circuit according to claim 1, further comprising:
a second rectifying element which has an anode terminal to which a power supply voltage is supplied, and a cathode terminal connected to the power supply terminal of said control circuit, said second rectifying element being formed in a semiconductor region separate from said first semiconductor region.

4. The switch circuit according to claim 3, wherein said second semiconductor region includes the semiconductor region in which said second rectifying element is formed.

5. The switch circuit according to claim 1, further comprising:
a second transistor of a conductive type different from that of said first transistor which has one of a source terminal and a drain terminal connected to said first terminal and another thereof connected to said second terminal, said second transistor turning on/off in sync with said first transistor.

6. The switch circuit according to claim 5, wherein said second transistor is formed in a third semiconductor region separate from said first and second semiconductor regions.

7. The switch circuit according to claim 1, wherein said first and second terminals are bi-directional input/output terminals, and further comprising:
a second rectifying element formed in said second semiconductor region, which has an anode terminal connected to said second terminal and a cathode terminal connected to the power supply terminal of said control circuit.

8. The switch circuit according to claim 1, further comprising:
a second rectifying element which has an anode terminal connected to the source terminal of said first transistor, and a cathode terminal connected to a substrate of said first transistor; and
a third rectifying element which has an anode terminal connected to the drain terminal of said first transistor, and a cathode terminal connected to the substrate of said first transistor.

9. The switch circuit according to claim 1, wherein said first rectifying element is formed of an MOS transistor which has a source or drain terminal shortcut to a gate terminal.

10. The switch circuit according to claim 7, wherein said at least one of said first and second rectifying elements is formed of an MOS transistor which has a source or a drain terminal shortcut to a gate terminal.

11. The switch circuit according to claim 5, wherein said control circuit includes:
a first logic circuit configured to control the gate voltage of said first transistor; and
a second logic circuit configured to control a gate voltage of said second transistor by a signal inverting an output of said first logic circuit.

12. A switch circuit formed on a semiconductor substrate, comprising:
a first terminal to which a signal of transmission object is inputted;
a second terminal from which a signal of transmission object is outputted;
a p-type first transistor which has one of source and drain terminals connected to said first terminal and another thereof connected to said second terminal;
a control circuit configured to control a gate voltage of said first transistor;
a first rectifying element formed in a first semiconductor region in said semiconductor substrate, which has an anode terminal to which a first power supply voltage is supplied and a cathode terminal connected to a back gate of said first transistor; and
a second rectifying element formed in a second semiconductor region in said semiconductor substrate separate from said first semiconductor region, which has an anode terminal connected to said first terminal and a cathode terminal connected to a power supply terminal of said control circuit.

13. The switch circuit according to claim 12, further comprising:
a third rectifying element formed in a semiconductor region separate from said first semiconductor region, which has an anode terminal to which a second power supply voltage is supplied and a cathode terminal connected to the power supply terminal of said control circuit.

14. The switch circuit according to claim 13, wherein said second semiconductor region includes the semiconductor region in which said third rectifying element is formed.

15. The switch circuit according to claim 12, further comprising a second transistor of a conductive type different from that of said first transistor, which has one of a source terminal and a drain terminal connected to said first terminal, and another thereof connected to said second terminal, said second transistor turning on/off in sync with said first transistor.

16. The switch circuit according to claim 15, wherein said second transistor is formed in a third semiconductor region separate from said first and second semiconductor regions.

17. The switch circuit according to claim 12, wherein said first and second terminals are bi-directional input/output terminals, and further comprising:
a third rectifying element formed in said second semiconductor region which has an anode terminal connected to said second terminal and a cathode terminal connected to the power supply terminal of said control circuit.

18. The switch circuit according to claim 12, further comprising:
a third rectifying element which has an anode terminal connected to the source terminal of said first transistor, and a cathode terminal connected to the back gate of said first transistor; and
a fourth rectifying element which has an anode terminal connected to the drain terminal of said first transistor, and a cathode terminal connected to the back gate of said first transistor.

19. The switch circuit according to claim 15, wherein said control circuit includes:
a first logic circuit configured to control the gate voltage of said first transistor; and
a second logic circuit configured to control a gate voltage of said second transistor by a signal inverting an output of said first logic circuit.

20. A switch circuit formed on a semiconductor substrate, comprising:
a first terminal to which a signal of transmission object is inputted;
a second terminal from which a signal of transmission object is outputted;

a first transistor formed in a first semiconductor region in said semiconductor substrate, which has one of emitter and collector terminals connected to said first terminal and another thereof connected to said second terminal;

a control circuit configured to control a base voltage of said first transistor; and a first rectifying element which has an anode terminal connected to said first terminal, a cathode terminal connected to a power supply terminal of said control circuit, said first rectifying element being formed in a second semiconductor region in said semiconductor substrate separate from said first semiconductor region.

21. A switch circuit formed on a semiconductor substrate, comprising:

a first terminal to which a signal of transmission object is inputted;

a second terminal from which a signal of transmission object is outputted;

a p-type first transistor which has one of emitter and collector terminals connected to said first terminal and another thereof connected to said second terminal;

a control circuit configured to control a base voltage of said first transistor;

a first rectifying element formed in a first semiconductor region in said semiconductor substrate, which has an anode terminal to which a power supply voltage is supplied and a cathode terminal connected to a back base of said first transistor; and a second rectifying element formed in a second semiconductor region in said semiconductor substrate separate from said first semiconductor region, which has an anode terminal connected to said first terminal and a cathode terminal connected to a power supply terminal of said control circuit.

* * * * *